(12) United States Patent
Ohira et al.

(10) Patent No.: US 8,232,630 B2
(45) Date of Patent: Jul. 31, 2012

(54) CONTACTLESS COMMUNICATION MEDIUM

(75) Inventors: Yutaka Ohira, Tokyo (JP); Chiaki Ishioka, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/070,447

(22) Filed: Mar. 23, 2011

(65) Prior Publication Data

US 2011/0169146 A1      Jul. 14, 2011

Related U.S. Application Data

(63) Continuation of application No. PCT/JP2010/064353, filed on Aug. 25, 2010.

(30) Foreign Application Priority Data

Aug. 26, 2009   (JP) .................................. 2009-195556

(51) Int. Cl.
    *H01L 23/02* (2006.01)
(52) U.S. Cl. ........................................ 257/679; 257/787
(58) Field of Classification Search .................. 257/666, 257/679, 680, 684, 688, 787, 782, 783
    See application file for complete search history.

(56) References Cited

U.S. PATENT DOCUMENTS

| | | | |
|---|---|---|---|
| 5,880,934 A | 3/1999 | Haghiri-Tehrani | |
| 7,838,976 B2* | 11/2010 | Yamazaki et al. | 257/684 |
| 8,011,589 B2* | 9/2011 | Kato et al. | 235/486 |
| 2008/0155822 A1* | 7/2008 | Finn | 29/832 |
| 2010/0078787 A1* | 4/2010 | Yakubo | 257/679 |
| 2010/0144070 A1* | 6/2010 | Takayama et al. | 438/23 |
| 2010/0277382 A1* | 11/2010 | Tanaka et al. | 343/741 |
| 2011/0092025 A1* | 4/2011 | Takayama et al. | 438/121 |
| 2011/0221578 A1* | 9/2011 | Sekiguchi et al. | 340/10.42 |

FOREIGN PATENT DOCUMENTS

| | | |
|---|---|---|
| EP | 2192530 A1 | 6/2010 |
| JP | H08-044840 A | 2/1996 |
| JP | 2002-152076 A | 5/2002 |
| JP | 3721520 B | 9/2005 |
| JP | 2009-140027 A | 6/2009 |
| WO | WO-2009/035094 | 3/2009 |

* cited by examiner

*Primary Examiner* — Sheila V Clark
(74) *Attorney, Agent, or Firm* — J. W. Judge

(57) ABSTRACT

Even when a mold part of an IC module is exposed from an opening provided in a substrate of an inlay, occurrence of malfunction, communication disorders or the like of the IC module due to the influence of an external impact or the like is prevented. By combining a sealing member including an insulating layer and an adhesive layer in a stacked manner to a shape covering a mold part of the IC module, occurrence of malfunction, communication disorders or the like of the IC module is prevented even if there is an influence of an external impact or the like. Meanwhile, by providing a sealing member, concentration of stress on the mold part in a line pressure test is alleviated by limiting the size of the sealing member, and also occurrence of cracks in the mold part can be prevented.

11 Claims, 9 Drawing Sheets

CONTACTLESS COMMUNICATION MEDIUM

BACKGROUND OF THE INVENTION

1. Field of the Invention

The present invention relates to a contactless communication medium.

2. Description of the Background Art

Conventionally, a technology of providing an antenna on a substrate and connecting the antenna to an IC module to form a contactless communication medium such as an IC card, an IC tag or the like which can perform data communication with an external read/write device is known (Japanese Patent Publication No. 3721520).

With the above-described conventional technology, when an inlet including an IC module mounted on an antenna sheet which has an antenna is combined with an insulating substrate or the like and the resultant assembly is used as a contactless communication medium, the substrate is made thick due to the thickness of a mold part or the like containing an IC chip sealed therein. Therefore, the inlet including the IC module mounted on the antenna sheet is combined with an inlay substrate having an opening in positional correspondence with the mold part so that the mold part is exposed from the opening.

In an IC card or the like, the outermost layer of the inlay is held between insulating resin substrates in a laminated manner; thus no serious problem occurs even with the above-described structure. However, especially, in the case where the inlay is in the outermost layer and thus the IC module part is exposed to the outermost layer, as in an electronic passport or the like, or in the case where the inlay is covered merely with a paper material or the like which is weak against electricity, the IC module is likely to be influenced by an external impact or the like. This causes malfunction or communication disorders of the contactless communication medium.

SUMMARY OF THE INVENTION

The present invention, made in order to solve the above-described problems, has an object of providing a contactless communication medium for reducing the influence of an external impact or the like on an IC module and thus reducing the possibility of malfunction or communication disorders, even with a structure in which a mold part of the IC module is exposed from an opening provided in a substrate of the inlay.

To achieve the above objects, a contactless communication medium according to the present invention comprises a first substrate, a second substrate, an antenna formed on the second substrate, and an IC module connected to the antenna. The IC module has at least a lead frame, an IC chip mounted on the lead frame, and a mold part for sealing the IC chip; the first substrate has an opening for exposing the mold part; the second substrate has a hole or recessed part for accommodating at least the mold part, the hole or recessed part having an area size larger than the mold part; a sealing member having an insulating layer and a adhesive layer in a stacked manner is located so as to cover the mold part, the sealing member being bonded to the mold part via the adhesive layer; and where the sealing member has a transverse width x and a longitudinal width y, the hole or recessed part of the second substrate has a transverse width a and a longitudinal width b, and the first substrate has a thickness of d, at least one of expressions:

$$x < a + 2d \quad (1) \text{ and}$$

$$y < b + 2d \quad (2)$$

is fulfilled.

In a contactless communication medium according to the present invention, only numerical expression (2) is fulfilled.

In a contactless communication medium according to the present invention, the sealing member further fulfills at least one of expressions:

$$x < a + 2d - 0.2 \text{ mm} \quad (3) \text{ and}$$

$$y < b + 2d - 0.2 \text{ mm} \quad (4).$$

In a contactless communication medium according to the present invention, only numerical expression (4) is fulfilled.

A contactless communication medium according to the present invention comprises a first substrate, a second substrate, an antenna formed on the second substrate, and an IC module connected to the antenna. The IC module has at least a lead frame, an IC chip mounted on the lead frame, and a mold part for sealing the IC chip; the first substrate has an opening for exposing the mold part; the lead frame is connected at a connection part of the antenna provided on the second substrate; a sealing member having an insulating layer and a adhesive layer in a stacked manner is located so as to cover the mold part, the sealing member being bonded to the mold part via the adhesive layer; and the sealing member is bonded to the second substrate via the adhesive layer in one direction in which the IC module and the antenna are connected to each other, among two directions parallel to sides of the mold part for sealing the IC chip; and the sealing member is provided so as not to contact the second substrate in the direction perpendicular to the one direction.

In a contactless communication medium according to the present invention, an outer surface of the first substrate and an outer surface of the sealing member are formed to be generally flat.

In a contactless communication medium according to the present invention, a step between the outer surface of the first substrate and the outer surface of the sealing member is 20 μm or less.

In a contactless communication medium according to the present invention, at least one of the insulating layer and the adhesive layer of the sealing member has a longitudinal elastic modulus which is smaller than that of the mold part.

According to the present invention, even in the case where the mold part of the IC module is exposed from the opening provided in the substrate of the inlay, adverse influences such as an external impact or the like on the IC module are reduced, and the possibility of malfunction or communication disorders is reduced.

BRIEF DESCRIPTION OF THE DRAWINGS

FIG. 2 shows an embodiment of an IC module.

FIG. 3 shows an embodiment of an antenna sheet as a second substrate.

FIG. 4 provides cross-sectional views showing an example of form of a sealing member.

FIG. 5 provides cross-sectional views showing an embodiment of a sealing member according to the present invention.

FIG. 6 provides cross-sectional views showing another embodiment of a sealing member according to the present invention.

FIG. 8 provides cross-sectional views showing another embodiment of a contactless communication medium according to the present invention.

DESCRIPTION OF THE PREFERRED
EMBODIMENTS

Now, an embodiment of the present invention will be described based on the drawings.

Figure 1:
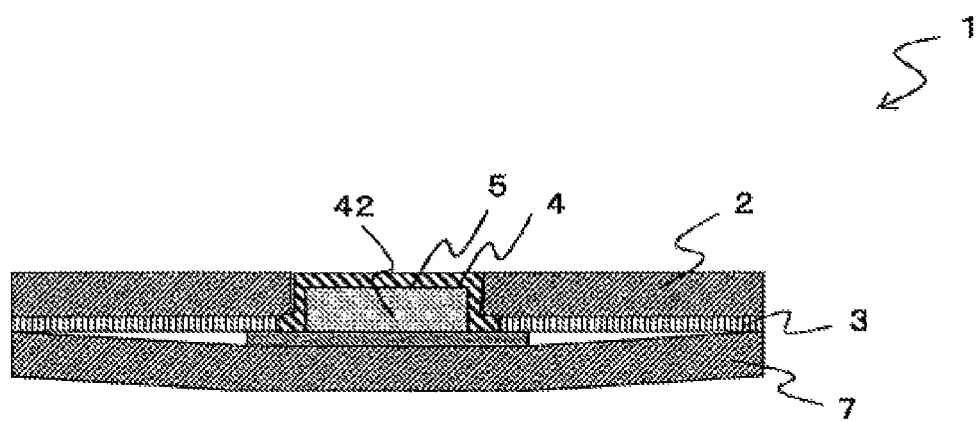
FIG. 1 is a cross-sectional view of an embodiment of a contactless communication medium according to the present invention.

FIG. 1 is a cross-sectional view showing an example of a contactless communication medium according to the present invention. As shown in FIG. 1, a contactless communication medium 1 includes a first substrate 2, a second substrate 3, and an IC module 4. As described later, an antenna is formed on the second substrate and is connected to the IC module 4. The first substrate has an opening for exposing the IC module 4 and a sealing member is located so as to cover a mold part of the IC module.

The contactless communication medium 1 shown in FIG. 1 has a structure in which an antenna sheet as the second substrate 3 and an inlet including the antenna and the IC module are held between the first substrate 2 and an inlay sheet 7. The antenna sheet has a hole, and the IC module 4 is fit into the hole and connected to the antenna. In the contactless communication medium, the inlet is held between the inlay sheet and the first substrate, and these elements are bonded in a laminated manner and integrated. Thus, the contactless communication medium is formed to have a desired thickness.

For the first substrate 2 and the inlay sheet 7, for example, an insulating plastic film (PET-G: noncrystalline copolyester; PVC: vinyl chloride resin, etc.), insulating synthetic paper (polyolefin-based synthetic paper produced by PPG; trade name: "Teslin" (registered trademark); or polypropylene-based synthetic paper produced by Yupo Corporation; trade name: "YUPO" (registered trademark)) or the like is used. The plastic film mentioned above is preferably a flexible plastic film. Regarding the thickness, a material having a thickness of, for example, about 100 μm to about 1000 μm, preferably about 100 μm to about 500 μm is usable. Owing to this, the material can fully exhibit functions as a substrate including a strength and the like, and also is provided with a sufficient flexibility and so is applicable to booklet-shaped uses.

The opening of the first substrate 2 and the hole of the second substrate 3 may be formed by punching or the like. After the first substrate and the second substrate are brought together, the hole of the second substrate 3 may be sealed in a similar manner to the opening of the first substrate 2. For sealing, an insulating resin material or the like is usable. Alternatively, an adhesive such as a two-liquid curable epoxy resin or the like is usable. Especially where a shock-resistant elastic epoxy resin is used, the IC module can be protected against impacts.

For the sealing member 5 for covering the mold part, for example, a resin tape including an insulating layer and an adhesive layer. The insulating layer preferably has electric insulation, heat resistance and moisture resistance. For the insulating layer, resin materials such as polyester-based resins, polypropylene-based resins, polyethylene-based resins, polystyrene-based resins, polyimide-based resins and the like are usable independently or in a mixed state. It is especially preferable to use a biaxially stretchable polyester resin. An adhesive such as an epoxy resin or the like is also usable. It is preferable that the insulating layer have a dielectric constant of, for example, about 1 to 5 ∈S.

For the adhesive layer, for example, a general viscous material such as an acrylic-based resin or the like is usable. The adhesive layer desirably has a thickness of 20 μm or greater in order to obtain a sufficient level of viscosity, but the thickness may be appropriately adjusted in consideration of the viscosity of the adhesive layer, the overall thickness of the sealing member and the like.

The sealing member 5 may have an overall thickness of about 25 μm to 100 μm, and more desirably 80 μm or less, for the following reasons. When the resin material is too thin, the sealing effect is lowered. When the resin material is too thick, a step may be caused when the sealing member 5 is combined with the first substrate.

The sealing member 5 in this embodiment is formed such that an outer surface of the first substrate and an outer surface of the sealing member 5 are continuous with each other and are generally flat, and such that the outer surface of the sealing member 5 is generally flush with the outer surface of the first substrate. Specifically, when the surfaces are "generally flat" or "generally flush", it is preferable that the step between the outer surface of the first substrate and the outer surface of the sealing member is 20 μm or less.

When a resin material is used for the sealing member 5, it is preferable to use a resin material having a longitudinal elastic modulus smaller than that of the mold part 42 of the IC module 4. When a resin tape including an adhesive layer is used for the sealing member, it is preferable to use a material in which at least one layer among the resin material and the adhesive layer has a longitudinal elastic modulus smaller than that of the mold part of the IC module.

Figure 2A:
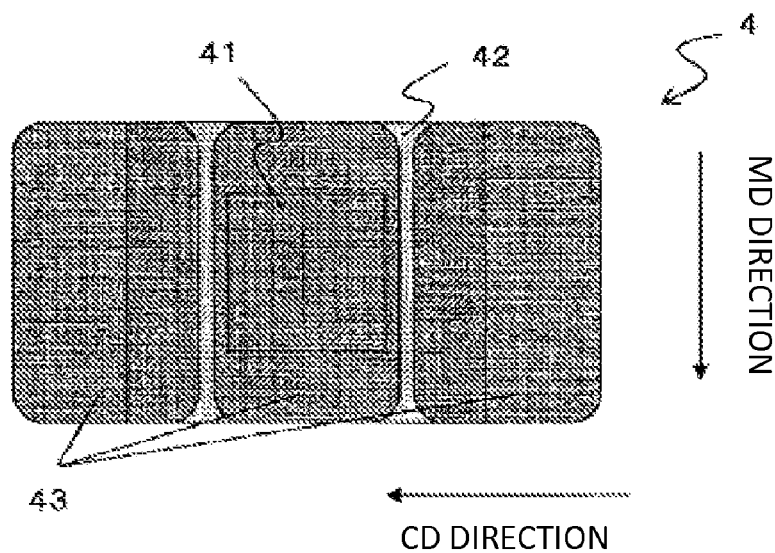
FIG. 2A is a plane view.
Figure 2B:
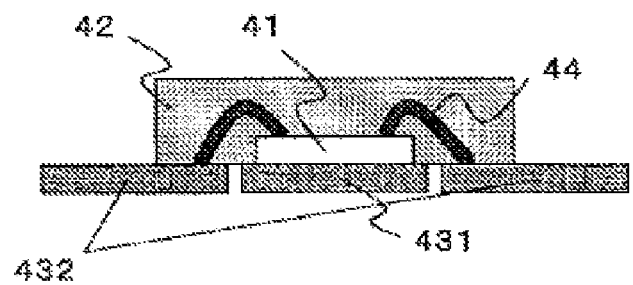
FIG. 2B is a cross-sectional view of FIG. 2A as seen in an MD direction.
Figure 2C:
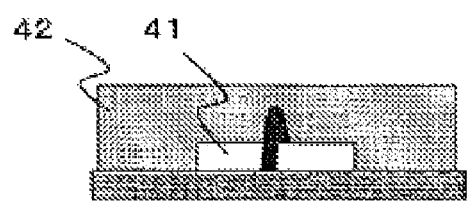
FIG. 2C is a cross-sectional view of FIG. 2A as seen in a CD direction.

FIG. 2 shows cross-sectional views of the IC module 4 usable for the present invention. FIG. 2A is a plan view of the IC module in this embodiment, FIG. 2B is a cross-sectional view of FIG. 2A as seen in an MD direction and FIG. 2C is a cross-sectional view of (a) as seen in a CD direction. CD and MD are two directions parallel to sides of the mold part.

As shown in FIGS. 2A and 2B, the IC module includes a lead frame 43, an IC chip 41 mounted on the lead frame, and the mold part 42 for sealing the IC chip.

The lead frame is formed of, for example, a copper filament metal film or the like obtained by knitting copper filaments into a film form and plating the film form with silver. The lead frame includes a die pad 431 for supporting and fixing the IC chip and terminal parts 432 connected to input/output pads of the IC chip.

The die pad 431 is formed to be larger by a certain degree than an outer profile of the IC chip 41, and is fixed to a bottom part of the IC chip. The die pad and each terminal part have a gap formed therebetween and are electrically insulated from each other.

The terminal parts are connected to the input/output pads (not shown) of the IC chip via bonding wires 44 of, for example, gold (Au) or the like.

The mold part 42 is formed of, for example, a resin material such as an epoxy resin or the like, and is formed so as to cover the IC chip, the input/output pads of the IC chip, the bonding wires, connection parts of the terminal parts and the bonding wires, and the like. The gaps between the die pad and the terminal parts are also filled with the mold part. The IC module is formed to have a thickness of, for example, about 0.3 mm.

Figure 3A:
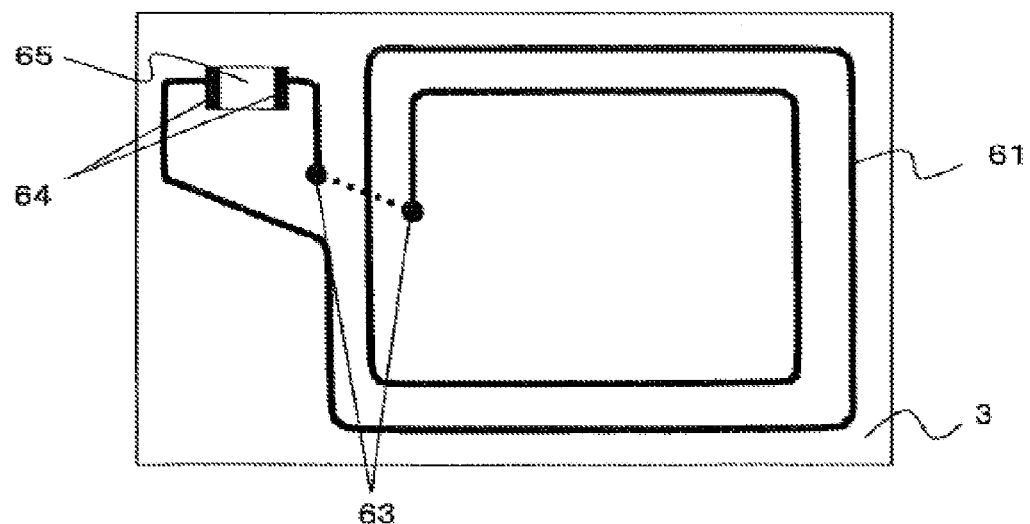
FIG. 3A shows a front surface.
Figure 3B:
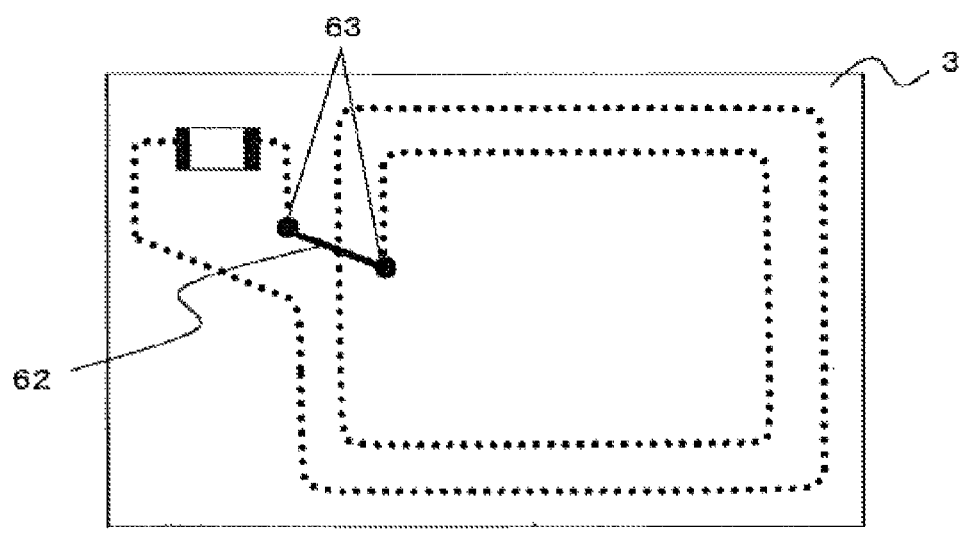
FIG. 3B shows a rear surface.

FIG. 3 shows an embodiment of the antenna sheet as the second substrate. FIG. 3A shows a front surface of the antenna sheet, and FIG. 3B shows a rear surface thereof. The antenna sheet is formed of, for example, a flexible material formed of PEN (polyethylene naphthalate) or PET (polyethylene terephthalate). The thickness of the antenna sheet is appropriately selected from a range of, for example, about 0.02 mm to about 0.10 mm. The antenna sheet shown in FIG. 3 is an example of an etched-type antenna formed as an antenna 61. On the front surface of the antenna sheet, the antenna 61 is formed, and on the rear surface thereof, a jumper wire 62 is formed.

The antenna 61 and the jumper wire 62 are electrically connected to each other by conduction parts 63 respectively provided therein. It is preferable to form the conduction parts to have a large area size so that the conduction is realized certainly with such an arrangement. The conduction of the antenna and the jumper wire is realized by, for example, crimping processing of pressurizing and caulking the antenna and the jumper wire from both sides and breaking the antenna sheet, or by forming a through-hole and filling the through-hole with a conductive paste such as a silver paste or the like. There is no specific limitation on the method of conduction as long as the antenna and the jumper wire are physically or electrically connected to each other.

The antenna 61 has connection parts 64 formed to connect the antenna 61 to the IC module. It is preferable to form the connection parts to have a large area size so that the connection to the IC module is realized easily with such an arrangement. However, the antenna may be formed to have a shape corresponding to a communication characteristic to be used by the contactless communication medium. Depending on the type of the antenna, the jumper wire may need to be formed on the front surface of the antenna sheet or no jumper wire may be necessary. The shape of the antenna is not limited to that shown in FIG. 3.

The antenna 61 and the jumper wire 62 are preferably, for example, an etched-type antenna formed by forming a thin film having a thickness of about 0.02 mm to 0.05 mm of aluminum, copper, silver or the like on the front surface of the antenna sheet, and patterning the thin film by etching or the like. The reason for this is that when the inlet is subjected to repeated flexure, stress caused by the repeated flexure is applied to parts in which the terminal parts of the IC module are connected to the connection parts of the antenna sheet, which improves the flexibility of the etched-type antenna and prevents stress from being concentrated on a specific site. However, the antenna according to the present invention is not limited to an etched-type antenna, and may be an antenna of a wound coil formed of a conductive wire, an antenna provided with conductive ink by printing, or the like.

The antenna sheet has a hole 65 for accommodating the IC module. This further reduces and also uniformizes the thickness of the contactless communication medium, prevents action of a local stress, and improves the resistance against flexure. By accommodating even the lead frame of the IC module in the hole, the IC module can be fixed. In the case where the parts of the antenna to be connected to the IC module are, for example, increased in area size and provided as the connection parts 64, the connection is realized easily.

In FIG. 3, the hole 65 has a size corresponding to the area size of the module part, but the present invention is not limited to this. In the case of, for example, a coil antenna which is connectable to the die pad without being fixed to the substrate, the hole may have such a size as to contain the die pad. Alternatively, connection parts with the antenna may be provided on the second substrate and thus the IC module may be directly mounted on the second substrate without forming the hole (see FIG. 8 described later).

The connection parts 64 of the antenna desirably have a width which is generally equivalent to, or slightly smaller than, that of the terminal parts of the IC module. Owing to this, stress can be dispersed in the width direction and can be prevented from being concentrated. In addition, the connection parts of the antenna may be connected, with certainty, over the entire width of the terminal parts of the IC module, and so the reliability of the antenna and the inlet can be improved.

The connection parts 64 of the antenna desirably have a length which is larger than that of parts in which the terminal parts of the IC module overlap the connection parts of the antenna. Owing to this, edges of the terminal parts are connected so as to be located at generally central parts of the connection parts of the antenna, which are internal to the ends of the connection parts of the antenna. Therefore, the edges of the terminal parts contact the generally central parts of the connection parts of the antenna which have a larger width than that of the antenna coil.

On the rear surface of the second substrate, reinforcing patterns (not shown) for reinforcing the connection parts of the antenna may be formed in positional correspondence with the areas in which the connection parts of the antenna are formed. Owing to this, the connection parts of the antenna can be supported and reinforced both by the second substrate and the reinforcing patterns formed on the rear surface thereof.

Accordingly, when the parts in which the terminal parts of the IC module and the connection parts of the antenna are connected to each other are subjected to repeated flexure, the edges of the terminal parts can be supported by the generally central parts of the connection parts of the antenna having the larger width. Owing to this, the concentration of stress on the antenna can be prevented and so breakage of the antenna can be prevented.

Now, the sealing member will be described in more detail with reference to FIG. 4 and FIG. 5. In FIG. 4 and FIG. 5, the contactless communication medium has a structure in which the antenna sheet as the second substrate and the inlet including the antenna and the IC module are held between the first substrate, the inlay sheet and a cover sheet. In the contactless communication medium shown in FIG. 4 and FIG. 5, the inlay sheet has a hole for accommodating the IC module in order to reduce the thickness of the IC module part, but the present invention is not limited to this. The hole may be a recessed part.

Figure 4A:
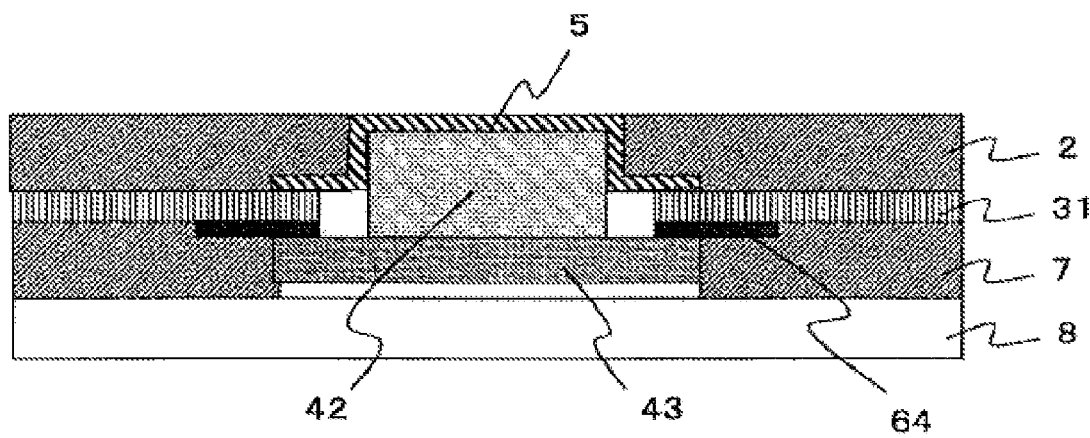
FIG. 4A is a cross-sectional view as seen in the MD direction.
Figure 4B:
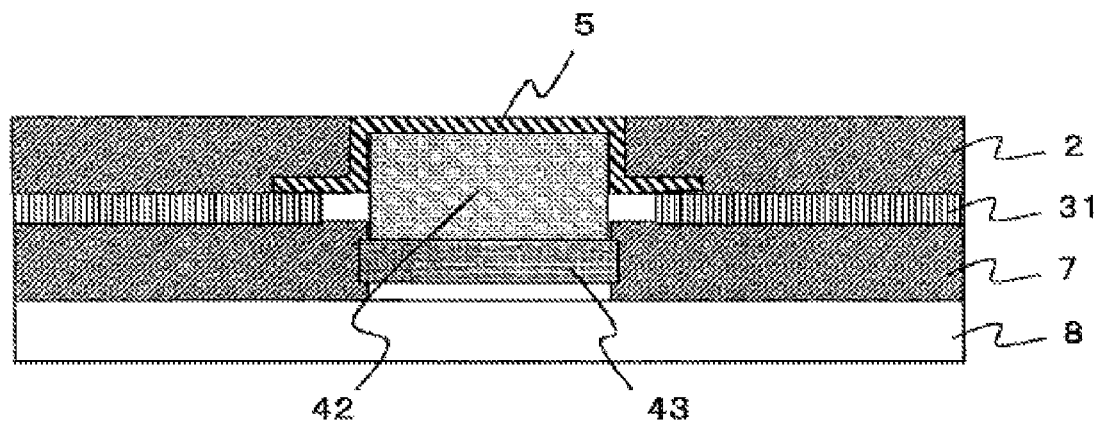
FIG. 4B is a cross-sectional view as seen in the CD direction.
Figure 5A:
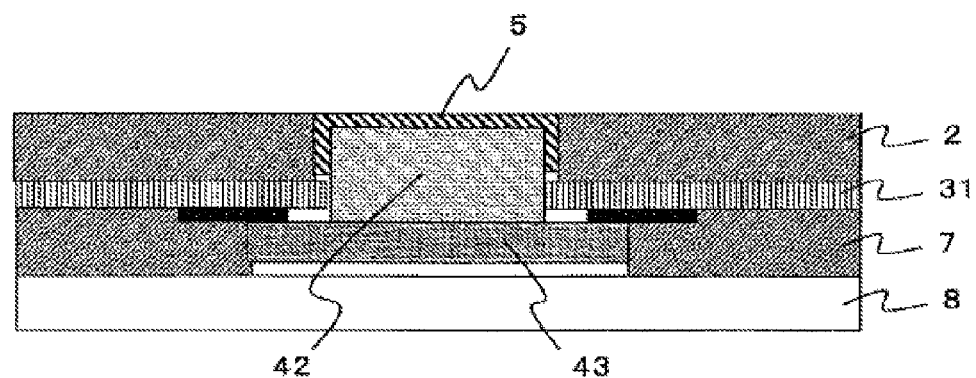
FIG. 5A is a cross-sectional view as seen in the MD direction.
Figure 5B:
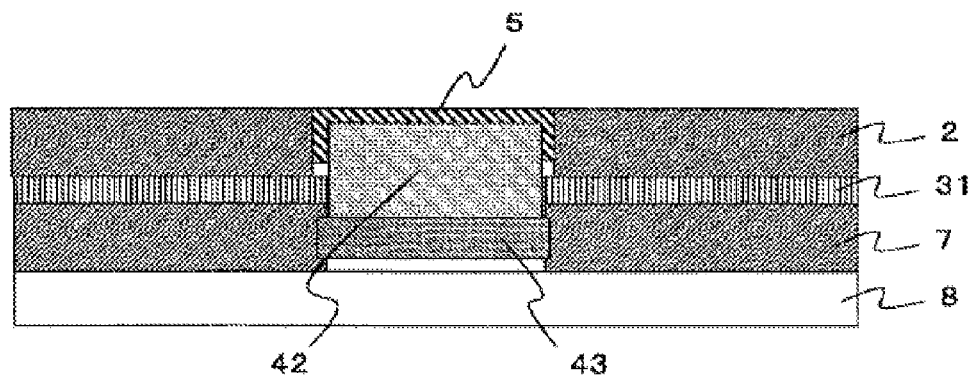
FIG. 5B is a cross-sectional view as seen in the CD direction.
Figure 6A:
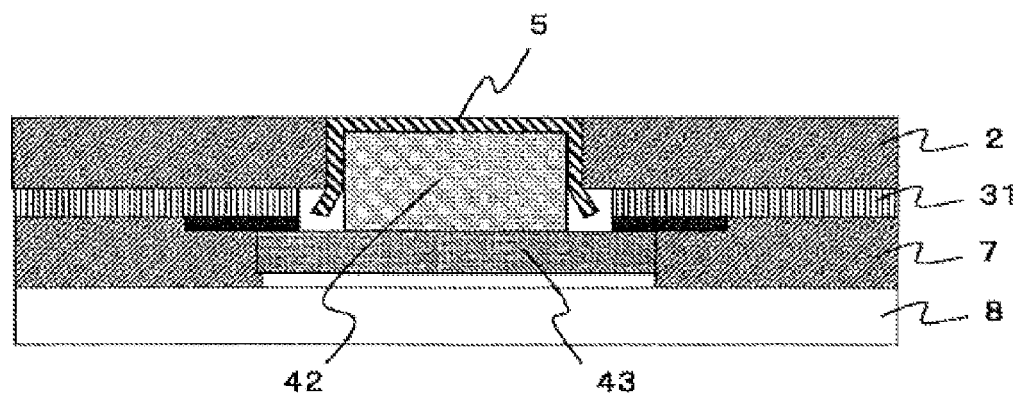
FIG. 6A is a cross-sectional view as seen in the MD direction.
Figure 6B:
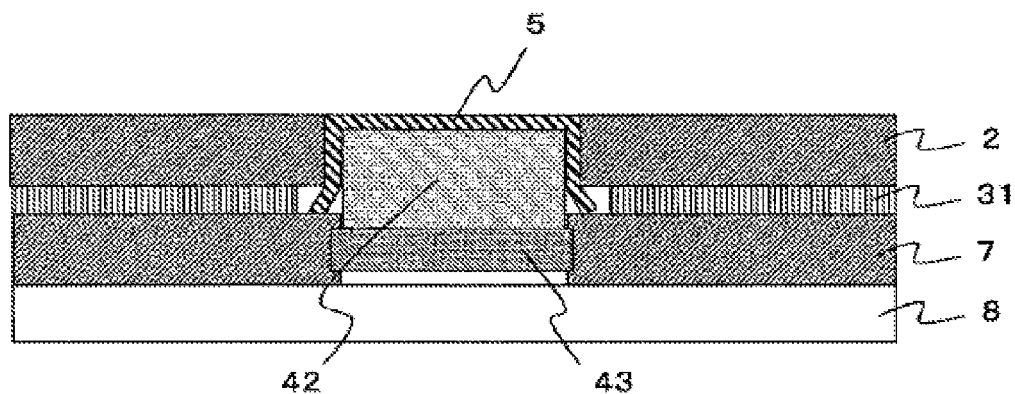
FIG. 6B is a cross-sectional view as seen in the CD direction.

It is desirable to combine the sealing member so as to cover a part of the antenna sheet in addition to the mold part as shown in FIG. 4A and FIG. 4B, because with such an arrangement, the bonding strength of the IC module and the antenna sheet is improved, and especially in the CD direction, the bonding strength of the IC module and the connection parts of the antenna is improved. By contrast, because the sealing member covers a large area, stress is likely to be applied on the mold part in the MD direction when a line pressure test is performed in the CD direction and stress likely to be applied on the mold part in the CD direction when a line pressure test is performed in the MD direction. This causes cracks.

The reason for this is as follows. When a line pressure is applied from a bottom surface of the IC module, a force of pressing the IC module upward is applied. However, where the sealing member is combined with the antenna sheet, there is no escape of the force because the antenna sheet is held between the first substrate and the inlay sheet, etc. and is firmly fixed. As a result, stress is applied on the mold part. By contrast, when ends of the sealing member are not in contact with the antenna sheet, the IC module is slightly movable, and the concentration of stress on the mold part can be prevented.

Thus, it is desirable that, as shown in FIG. 5A, FIG. 5B, FIG. 6A and FIG. 6B, the sealing member has a size by which the sealing member does not contact the antenna sheet in at least one of the MD direction and the CD direction.

FIG. 5 shows a structure in which the ends of the sealing member are located between the opening of the first substrate and side surfaces of the mold part. By matching the opening of the first substrate to the diameter of the mold part, the sealing member is pressed by inner side surfaces of the opening of the first substrate when the first substrate is combined, and is bonded to the side surfaces of the mold part. Thus, the ends of the sealing member are fixed. In FIG. 6, the width of the hole of the second material is larger than the diameter of the module by a degree at which the ends of the sealing member do not contact the substrate. Therefore, the sealing member does not contact the antenna sheet.

Figure 7:
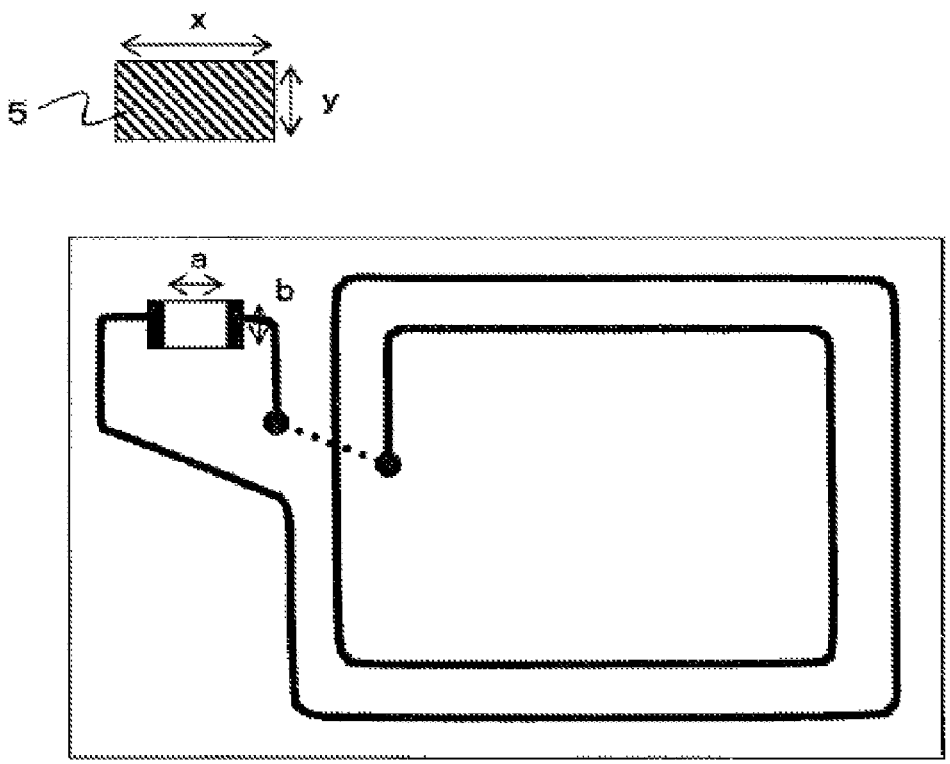
FIG. 7 is a view illustrating expressions (1) through (4) according to the present invention.

In order to realize this structure, a sealing member fulfilling at least one of:

$$x<a+2d \qquad (1)$$

and $$y<b+2d \qquad (2)$$

may be used where the transverse width of the sealing member (CD direction) is x, the longitudinal width of the sealing member (MD direction) is y, the transverse width of the hole of the second substrate is a, the longitudinal width of the hole of the second substrate is b, and the thickness of the first substrate is d (see FIG. 7).

The conditions of (1) and (2) are provided in consideration that the sealing member is bonded to both side surfaces of the mold part by being pressed to both of the side surfaces of the mold part 42 by the inner side surfaces of the opening of the first substrate. When these conditions are fulfilled, a part of the sealing member which is not pressed by the inner side surfaces of the opening of the first substrate may be naturally hung, or a part of the sealing member may contact the side surfaces of the mold part because of some reason, etc. When this occurs, the sealing member is necessarily prevented from contacting the antenna sheet. Even taking a form of expanding in a horizontal direction, the sealing member does not contact antenna sheet (see FIG. 6).

Therefore, when the sealing member 5 fulfilling at least one of expressions (1) and (2) is used, the sealing member can be prevented with certainty from contacting the antenna sheet in at least one of the MD direction and the CD direction. When a line pressure test is performed, generation of cracks due to the application of stress on the mold part 42 can be prevented.

At least one of (1) and (2) needs to be fulfilled, but it is preferable to fulfill only the condition of (2). The reason for this is that the sealing member is formed so as to cover the connection parts in the CD direction in which the IC module 4 and the antenna are connected to each other and so the sealing member is not bonded to the second substrate (antenna sheet) 31 in the CD direction perpendicular to the MD direction. The reason for this is as follows. The CD direction is the direction of the longer sides of the lead frame 43, and the terminal parts are formed so as to protrude from the mold part 42 and are connected to the connection parts 64 of the antenna at these sites. It is desirable to prioritize the secured prevention of the invasion of static electricity by covering the connection parts with the sealing member 5. When the condition in the MD direction is fulfilled, the generation of cracks in the mold part can be prevented when a line pressure is applied in the CD direction. Therefore, the orientation of the IC module 4 with respect to the contactless communication medium may be determined where the CD direction is a direction in which a line pressure is presumed to be often applied due to pressurization, etc. with a roller when, for example, the contactless communication medium passes through a machine during the production or actual use.

This condition is provided in consideration that the surface of the first substrate 2 and the surface of the sealing member 5 are formed to be generally flat, that the thickness of the sealing member is actually very thin as compared to the transverse width of the mold part 42, etc. although enlarged in the figure (for the sake of clarification), and the like.

Based on (1) and (2) mentioned above, precision of production facilities will be considered. Considering that the precision of combining the second substrate 31 with the IC module 4 is generally ±0.1 mm at the maximum and that the precision of combining the sealing member with the IC module is generally ±0.1 mm at the maximum, the precision of combining the sealing member with the second substrate is ±0.2 mm at the maximum.

Accordingly, it is preferable that the transverse width x and the longitudinal width y of the sealing member 5 further fulfill at least one of:

$$x<a+2d-0.2 \text{ mm} \qquad (3)$$

and $$y<b+2d-0.2 \text{ mm} \qquad (4).$$

Owing to this, even where the sealing member is combined with the second substrate 31 with an offset of 0.2 mm at the maximum, the sealing member can be prevented with certainty from contacting the antenna sheet. Regarding expressions (3) and (4), at least one thereof needs to be fulfilled as in the case of expressions (1) and (2), but it is more preferable that only numerical expression (4) is fulfilled.

Where the width of the module in the CD direction is cd and the width thereof in the MD direction is md, the diameter of the module can be substituted into (1) and (2) as follows when there is no hole or when cd=a and md=b.

$$x<cd+2d \qquad (1')$$

and $$y<md+2d \qquad (2').$$

Similarly, where the width of the module in the CD direction is cd and the width thereof in the MD direction is md, the diameter of the module can be substituted into (3) and (4) as follows when there is no hole or when CD=x and MD=y.

$$x<cd+2d-0.2 \text{ mm} \qquad (3')$$

and $$y<md+2d-0.2 \text{ mm} \qquad (4').$$

It is desirable that the sealing member 5 cover the entire outer surface of the mold part 42, or 90%, at the minimum, of both of the longitudinal width and the transverse width of the surface of the mold part. This is also applicable even where the sealing member is combined with an offset because of the lack of precision of production facilities.

Now, the functions of this embodiment will be described.

In the contactless communication medium in this embodiment, as shown in FIG. 1, the opening for exposing the mold part 42 of the IC module 4 is formed in the first substrate, and the sealing member 5 including the insulating layer is combined so as to cover the mold part. Therefore, the occurrence of adverse influences due to the invasion of static electricity on the IC module part can be reduced.

By filling the gaps between the opening of the first substrate 2 and the mold part with the sealing member 5, during a flatness test such as a ballpoint pen test, a ballpoint pen is prevented from being caught in the gaps. Thus, the flatness and smoothness of the outer surface of the contactless communication medium formed of the outer surface of the first substrate and the outer surface of the sealing member can be improved.

The sealing member 5 is disposed so as to cover the outer surface of the IC module 4. In addition, the outer surface of the first substrate 2 and the outer surface of the sealing member are continuously formed to be generally flat and generally flush with each other. Therefore, even when a step is made between the outer surface of the first substrate and the outer surface of the IC module including the outer surface of the mold part 42, the outer surface of the first substrate and the outer surface of the sealing member can be generally flush with each other. Accordingly, the flatness and smoothness of the outer surface of the contactless communication medium formed of the outer surface of the first substrate and the outer surface of the sealing member can be improved.

The step between the outer surface of the first substrate 2 and the outer surface of the sealing member 5 is 20 μm or less. Therefore, the outer surface of the contactless communication medium formed of the outer surface of the first substrate and the outer surface of the sealing member can be generally flat and flush with each other. The criterion for passing a flatness test such as a ballpoint pen test or the like can be fully satisfied. The step is more preferably 15 μm or less. Owing to this, the disorder ratio in the ballpoint pen test can be made generally 0%.

A resin tape is used for the sealing member 5. Therefore, the positioning of the sealing member is made easier, and so the production process of the contactless communication medium is simplified, the yield is improved, and the production cost is reduced.

In the case where a resin tape, in which the insulating layer or the adhesive layer has a longitudinal elastic modulus smaller than that of the mold part 42 of the IC module 4, is used for the sealing member 5, the impact applied to the contactless communication medium is dispersed to the sealing member 5 as elastic energy. This provides an effect of reducing the impact applied to the IC module 4. The sealing member is elastically deformable more easily than the mold part of the IC module. Therefore, even when the outer surface of the first substrate is deformed and recessed by an external force received by the tip of a ballpoint pen in a ballpoint pen test, the sealing member is elastically deformed so as to reduce the step between the outer surface of the first substrate and the outer surface of the sealing member while the tip of the pen moves from a position on the outer surface of the first substrate to a position on the outer surface of the sealing member. Owing to this, stress in the advancing direction of the tip of the ballpoint pen, which is caused due to the step between the outer surface of the first substrate and the outer surface of the sealing member, can be reduced.

By limiting the size of the sealing member 5 to a size with which the sealing member 5 does not contact the second substrate in at least one of the MD direction and the CD direction, the generation of cracks caused by stress on the mold part 42 during a line pressure test can be prevented. In the case where the size of the sealing member is determined in consideration of the offset which is caused by the precision of the production facilities when, for example, the IC module is combined with the second substrate or the sealing member is combined with the IC module, the sealing member can be prevented with more certainty from contacting the second substrate.

As described above, according to the contactless communication medium of the present invention, the invasion of the static electricity into the IC module can be prevented, the requirements regarding the flatness of the outer surface can be fulfilled, and the generation of cracks in the mold part can be prevented.

Now, a method for producing a contactless communication medium according to the present invention will be described.

Herein, a case of the contactless communication medium as shown in FIG. 1 including a first substrate, an inlet including an antenna and an IC module provided on an antenna sheet as a second substrate, and an inlay sheet will be described.

Here, the contactless communication medium is produced as follows. For example, first, an IC module is located in a hole of the antenna sheet having the antenna formed thereon and is connected with the antenna, thus to form an inlet. A mold part of the IC module is covered with a sealing member. Next, this is held between the inlay sheet and the first substrate, and these elements are stacked such that the IC module is accommodated in an opening made in the first substrate.

Next, a pressing step of pressing the first substrate and the inlay sheet from outside so that the first substrate and the inlay sheet are mutually pressed is performed. By this pressing step, the first substrate, the inlet, the inlay sheet and the sealing member in the opening are compressed, and the outer surface of the first substrate and the outer surface of the sealing member are formed to be generally flat and generally flush with each other.

In the case where the synthetic paper as described above is used for the first substrate and the inlay sheet, the inlet, the first substrate and the inlay sheet are bonded together by an adhesive lamination method as follows. An adhesive is applied to the antenna sheet of the inlet or to a surface of the first substrate and a surface of the inlay sheet which are to contact the antenna sheet, and these elements are bonded together at a relatively low temperature of, for example, about 70° C. to 140° C.

As the adhesive, for example, EVA (ethylene vinyl acetate resin)-based, EAA (ethylene-acrylic acid copolymerizable resin)-based, polyester-based, polyurethane-based or other adhesives are usable.

Instead of applying the adhesive, an adhesive sheet using any of the above-mentioned resins usable as the adhesive may be held between the antenna sheet and the first substrate and between the antenna sheet and the inlay sheet.

In the case where a thermoplastic film is used for the first substrate and the inlay sheet, the inlet, the first substrate and the inlay sheet are bonded together by a thermal lamination method as follows. The inlet and the first substrate, and the inlet and the inlay sheet, are pressurized while being heated to a temperature exceeding the softening temperature of the first substrate and the inlay sheet, for example, about 130° C. to 170° C. to cause melt-bonding. Even when the thermal lamination method is used, any of the above-mentioned adhesives may also be used in order to cause melt-bonding more certainly.

After the inlet, the first substrate and the inlay sheet are bonded together, the external shape of the integrated first substrate, inlay sheet and inlet is processed into a desired shape.

In this manner, the contactless communication medium shown in FIG. 1 can be produced.

In the above embodiment, the pressing step is introduced for producing the contactless communication medium, but the pressing step is not absolutely necessary. Even without the pressing step, the gaps between the IC module and the inner side surfaces of the opening of the substrate may be filled with the sealing member. The outer surface of the substrate and the outer surface of the sealing member can be formed to be flat by use of, for example, a roller, a scraper or the like instead of the pressing step.

Here, regarding the softening temperature of the first substrate and the inlay sheet, the softening temperature of PET-G is about 105° C. to 150° C., and the softening temperature of PVC is about 80° C. to 100° C.

By contrast, the antenna sheet as the second substrate is formed of PEN or PET as described above in the embodiment. The softening temperature of PEN is about 269° C., and the softening temperature of PET is about 258° C. Namely, the upper temperature limit can be increased as compared with the thermoplastic material conventionally used for the antenna sheet such as PET-G or the like having a low softening temperature.

Therefore, when the first substrate, the antenna sheet as the second substrate, and the inlay sheet are heated to about 130° C. to 170° C., the first substrate and the inlay sheet are softened but the antenna sheet is not softened. Owing to this, even when the antenna sheet is heated while the inlet including the antenna sheet, the first substrate and the inlay sheet are stacked and bonded by the thermal lamination method, fluidization due to plasticization can be prevented. Accordingly, the movement of the antenna due to the fluidization of the antenna sheet can be prevented to improve the reliability of data communication.

Even if the antenna sheet is overheated to a temperature exceeding the softening temperature and as a result, is plasticized and fluidized, if the antenna coil is formed of an etched-type antenna, the contact area size between the antenna and the antenna sheet is increased, and the fluidization resistance of the antenna can be increased. Therefore, the antenna can be prevented from moving along with the fluidization of the antenna sheet, and the reliability of data communication can be improved.

Figure 8A:
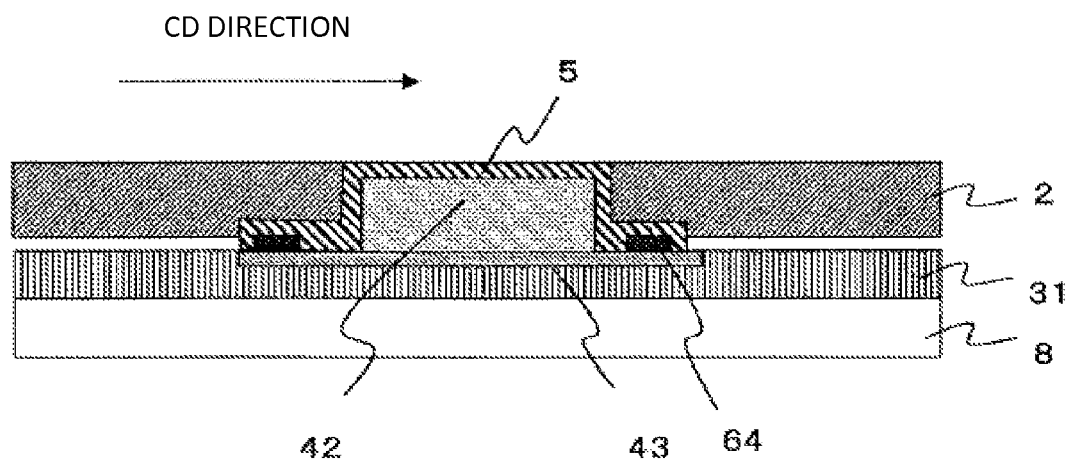
FIG. 8A is a cross-sectional view as seen in the MD direction.
Figure 8B:
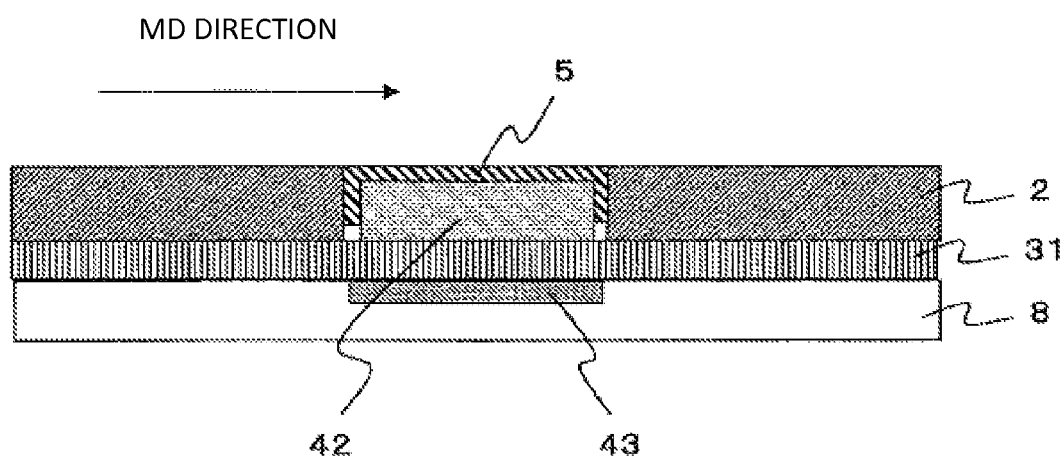
FIG. 8B is a cross-sectional view as seen in the CD direction.

FIG. 8 provides cross-sectional views of another structural example of a contactless communication medium according to the present invention. FIG. 8A is a cross-sectional view taken along a straight line crossing the IC chip in the CD direction. FIG. 8B is a cross-sectional view taken along a straight line crossing the IC chip in the MD direction. FIG. 8 shows a structure in which the second substrate 31 forming the antenna also acts as an inlay sheet. The second substrate does not have a hole, and the connection parts 64 of the antenna are directly connected to the die pad 43 of the IC module provided on the substrate. In this case also, a structure is preferable in which, as shown in the figures, the sealing member is formed so as to cover the connection parts in the CD direction in which the IC module and the antenna are connected to each other, and the sealing member does not contact the second substrate (antenna sheet) 31 in the MD direction perpendicular to the CD direction.

Figure 9:
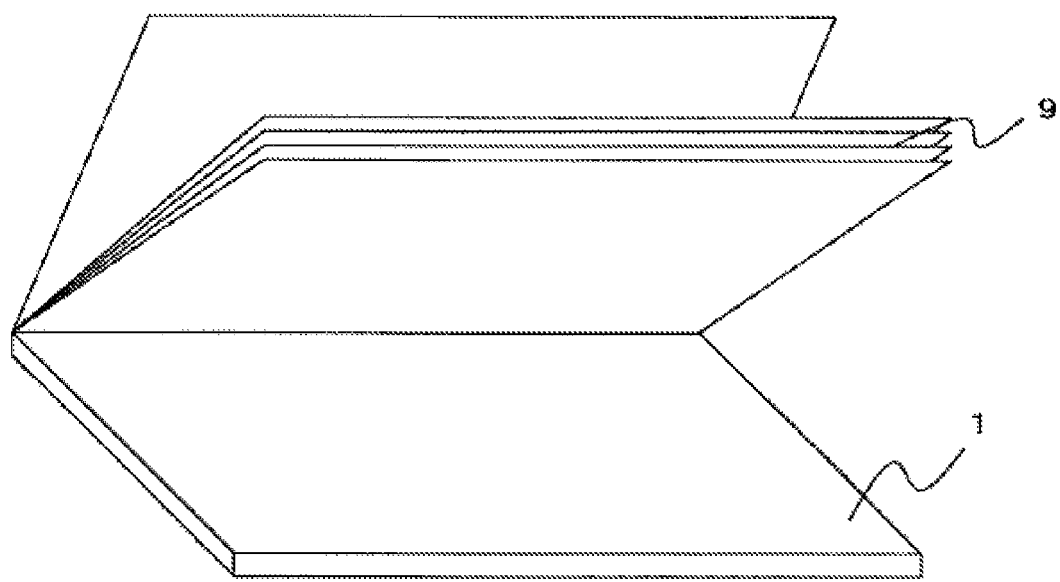
FIG. 9 is a schematic view in the case where a contactless communication medium according to the present invention is an electronic passport.

Now, an electronic passport will be described as an example of a contactless communication medium according to the present invention. As shown in FIG. 9, the electronic passport has the above-described contactless communication medium as a cover sheet, and has a booklet part 9 held between cover sheets. To one surface of the contactless communication medium, a cover material acting as the cover sheet of the electronic passport is bonded.

An inlay sheet is provided in a layer below the antenna sheet as the second substrate of the contactless communication medium, and in a layer below this layer, a sheet bonded with the cover sheet is used. Owing to this, the external appearance and the feel of the electronic passport provided with the contactless communication medium can be made equivalent to those of a conventional passport. The contactless communication medium prevents the invasion of static electricity and has an improved flatness of the outer surface. Therefore, an electronic passport having a high reliability of data communication, improved easiness of writing letters and improved printability of stamps, and a good external appearance can be provided. In the case where only the cover sheet is used as the second substrate and the antenna is formed directly on the cover sheet, the contactless communication medium can be further reduced in thickness and provided with improved flexibility.

In the above embodiment, an electronic passport is described as an example of the contactless communication medium, but the contactless communication medium according to the present invention is usable for, for example, electronic ID documents, various types of electronic certificates of activity history, and the like other than the electronic passports.

EXAMPLE 1

As the first substrate, polyolefin-based synthetic paper having a thickness of 178 μm and including an opening at a position at which the IC module is to be located is used. As the second substrate, an antenna sheet is used. As the inlay sheet, polyolefin-based synthetic paper having a thickness of 178 μm is used.

First, an IC module was fit into a hole of the antenna sheet including an antenna and the hole and the IC module was connected to the antenna to obtain an inlet.

Then, an aqueous emulsion adhesive (EAA) was applied to the first substrate and the inlay sheet, and a sealing member formed of a resin tape was located on the IC module of the inlet so as to cover the mold part. The antenna sheet was held between the first substrate and the inlay sheet such that the IC module and the opening of the first substrate would match each other positionally, and these elements were combined and pressurized to obtain a contactless communication medium. For the sealing member, a resin tape including an insulating layer formed of a 25 μm-thick polyester film and a 25 μm-thick adhesive layer stacked on the insulating layer was used.

With respect to the contactless communication medium in which the mold part had a size of 4.8 mm×5.1 mm (longitudinal×transverse) and the hole of the antenna sheet had a size of 5.2 mm×5.3 mm (longitudinal×transverse), the longitudinal width of the sealing member was varied to obtain samples 1-1, 1-2, 1-3, 1-4, 1-5 and 1-6. Regarding the sizes of the sealing members, 1-1 had a size of 8 mm×13 mm, 1-2 had a size of 7 mm×13 mm, 1-3 had a size of 6 mm×13 mm, 1-4 had a size of 5.5 mm×13 mm, 1-5 had a size of 5 mm×13 mm, and 1-6 had a size of 4.5 mm×13 mm.

The cross-section of each obtained contactless communication medium was measured with an electronic microscope. In any of samples 1-1 through 1-5, there was no gap between the inner side surfaces of the opening of the first substrate and the mold part of the IC module. Sample 1-6 was confirmed to have gaps at both ends of the sealing member in the longitudinal width direction. The total size of the gaps was 0.5 mm. In all of samples 1-1 through 1-6, the step between the outer surface of the sealing member covering the IC module and the outer surface of the first substrate was 20 µm or less.

Next, a static electricity test was performed on the obtained samples in conformity with ISO10373-7 and JIS X6305-7.

First, the direction of the longer side of the rectangle of the contactless communication medium was set as the right-left direction, and the direction of the shorter side thereof was set as the up-down direction. Each sample was located such that the first substrate would be on top and the opening would be at the upper right corner of the rectangle as seen in a plan view. From the outer surface of the substrate having the opening, voltages of +6 kV, −6 kV, +8 kV and −8 kV were sequentially applied. Each time a different voltage was applied, the basic operation of the IC chip was confirmed, and the communication response of the contactless communication medium was measured.

The voltages for the sequential measurement were applied at 25 positions in total, namely, 20 areas (position: 20) obtained by dividing a rectangular area which was enclosed by the antenna coil as an outer perimeter and was longer in the transverse direction into 4 in the longitudinal direction and into 5 in the transverse direction (4×5), the center of the mold part of the IC module (position: center), a position on the substrate left to the opening (position: left), a position on the substrate right to the opening (position: right), a position on the substrate upper to the opening (position: upper), and a position on the substrate lower to the opening (position: lower).

The result of the measurements in the static electricity test shows a good communication response with all of samples 1-1 through 1-6, at all the voltages and at all the positions.

Next, a ballpoint pen test was performed on the samples. The ballpoint pen test was performed by allowing a ballpoint pen to run on the outer surface of the first substrate in the direction of the longer side of the antenna coil so as to pass over the IC module. A commercially available ballpoint pen having a diameter of 1 mm was used. The ballpoint pen was allowed to run at a load of 600 g and a rate of 25 mm/sec. After the ballpoint pen was run in a reciprocating motion 25 times, the basic operation of the IC chip was confirmed, and the communication response of the contactless communication medium was measured.

The result of the ballpoint pen test shows a good communication response was obtained with all of samples 1-1 through 1-6.

A stamp test was performed on the samples. The stamp test was performed by applying a load on the outer surface of the substrate having the opening using a stamp.

The diameter of the tip of the punch of the stamp used was 10 mm. After an impact of a load of 250 g was applied 50 times at a height of fall of 320 mm, the basic operation of the IC chip was confirmed, and the communication response of the contactless communication medium was measured.

The result of the stamp test shows a good communication response was obtained with all of samples 1-1 through 1-6.

A line pressure test in the CD direction was performed on the samples. The line pressure test was performed by orienting the sample such that the cover sheet side of the sample would contact a jig and the central position of the mold would be at the central position of a side of the jig, and pulling the sample from an end thereof with a load.

The jig used was a right-angled metal jig having a width of 50 mm and r=2.5. After the sample was pulled at a load of 250 N, the basic operation of the IC chip was confirmed, and it was checked whether the mold part had been cracked.

The result of the line pressure test shows the mold part was cracked in all of samples 1-1 through 1-3.

In sample 1-4, the mold part was not cracked because the longitudinal width of the sealing member was shorter than a sum of the longitudinal width of the hole and twice the thickness of the first substrate and so basically the sealing member did not contact the antenna sheet. However, when a plurality of samples were created in similar conditions and tested, it was confirmed that the sealing member contacted the antenna sheet on rare occasions depending on the lack of precision of the production facilities and the mold part was cracked because of this influence.

In samples 1-5 and 1-6, the sealing member had a size in consideration of the precision of the production facilities, and the mold part was not cracked in either of the samples.

COMPARATIVE EXAMPLE 1

A sample was created in substantially the same method as in Example 1 except that the sealing member was not used.

The cross-section of the obtained contactless communication medium was measured with an electronic microscope. Gaps of about 50 µm were made between the inner side surfaces of the opening of the first substrate and the IC module, and the step between the outer surface of the mold part of the IC module and the outer surface of the substrate having the opening was larger than 20 µm.

The above-described static electricity test was performed. Communication response disorders occurred at some of the voltages and at some of the positions. The result of the above-described ballpoint pen test shows communication response disorders occurred. The result of the above-described stamp test shows communication response disorders occurred. By contrast, the result of the line pressure test shows the mold part was not confirmed to have been cracked even though there was no sealing member.

Based on the above-described results, in this embodiment using the sealing member, the invasion of static electricity into the IC chip can be prevented. By fulfilling the flatness requirements on the outer surface, the occurrence of disorders in the ballpoint pen test or the stamp test can be prevented. In addition, the sealing member is prevented from contacting the second substrate, and thus the mold part can be prevented from being cracked in the line pressure test. By contrast, in Comparative Example 1 in which the sealing member is not used, the probability that the communication response disorders occur after each of the tests other than the line pressure test is very high.

What is claimed is:
1. A contactless communication medium, comprising:
a first substrate, a second substrate, an antenna formed on the second substrate, and an IC module connected to the antenna; wherein:
the IC module has at least a lead frame, an IC chip mounted on the lead frame, and a mold part for sealing the IC chip;
the first substrate has an opening for exposing the mold part;
the second substrate has a hole or recessed part for accommodating at least the mold part, the hole or recessed part having an area size larger than the mold part;

a sealing member having an insulating layer and an adhesive layer in a stacked manner is located so as to cover the mold part, the sealing member being bonded to the mold part via the adhesive layer; and where the sealing member has a transverse width x and a longitudinal width y, the hole or recessed part of the second substrate has a transverse width a and a longitudinal width b, and the first substrate has a thickness of d, at least one of the following expressions:

$$x<a+2d \quad (1)$$

and $$y<b+2d \quad (2)$$

is fulfilled.

2. A contactless communication medium according to claim 1, wherein only numerical expression (2) is fulfilled.

3. A contactless communication medium according to claim 1, wherein the sealing member further fulfills at least one of the following expressions:

$$x<a+2d-0.2 \text{ mm} \quad (3)$$

and $$y<b+2d-0.2 \text{ mm} \quad (4).$$

4. A contactless communication medium according to claim 3, wherein only numerical expression (4) is fulfilled.

5. A contactless communication medium according to claim 1, wherein an outer surface of the first substrate and an outer surface of the sealing member are formed to be generally flat.

6. A contactless communication medium according to claim 5, wherein a step between the outer surface of the first substrate and the outer surface of the sealing member is 20 μm or less.

7. A contactless communication medium according to claim 1, wherein at least one of the insulating layer and the adhesive layer of the sealing member has a longitudinal elastic modulus which is smaller than that of the mold part.

8. A contactless communication medium, comprising:
a first substrate, a second substrate, an antenna formed on the second substrate, and an IC module connected to the antenna; wherein:
the IC module has at least a lead frame, an IC chip mounted on the lead frame, and a mold part for sealing the IC chip;
the first substrate has an opening for exposing the mold part;
the lead frame is connected at a connection part of the antenna provided on the second substrate;
a sealing member having an insulating layer and an adhesive layer in a stacked manner is located so as to cover the mold part, the sealing member being bonded to the mold part via the adhesive layer; and
the sealing member is bonded to the second substrate via the adhesive layer in one direction in which the IC module and the antenna are connected to each other, among two directions parallel to sides of the mold part for sealing the IC chip; and the sealing member is provided so as not to contact the second substrate in the direction perpendicular to the one direction.

9. A contactless communication medium according to claim 8, wherein an outer surface of the first substrate and an outer surface of the sealing member are formed to be generally flat.

10. A contactless communication medium according to claim 9, wherein a step between the outer surface of the first substrate and the outer surface of the sealing member is 20 μm or less.

11. A contactless communication medium according to claim 8, wherein at least one of the insulating layer and the adhesive layer of the sealing member has a longitudinal elastic modulus which is smaller than that of the mold part.

* * * * *